US012804839B2

(12) United States Patent
Wang et al.

(10) Patent No.: US 12,804,839 B2
(45) **Date of Patent: *Nov. 17, 2026**

(54) FOLDABLE CONNECTION MECHANISM WITH ARTICULATED LOCKING STRUCTURES AND DISPLAY DEVICE

(71) Applicant: HKC CORPORATION LIMITED, Shenzhen (CN)

(72) Inventors: Hongsong Wang, Shenzhen (CN); Lidan Ye, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 239 days.

This patent is subject to a terminal disclaimer.

(21) Appl. No.: 18/743,134

(22) Filed: Jun. 14, 2024

(65) Prior Publication Data

US 2025/0024623 A1 Jan. 16, 2025

(30) Foreign Application Priority Data

Jul. 11, 2023 (CN) ......................... 202310840851.6

(51) Int. Cl.
*H05K 7/00* (2006.01)
*H05K 7/14* (2006.01)

(52) U.S. Cl.
CPC .................................. *H05K 7/1417* (2013.01)

(58) Field of Classification Search
CPC ...... H05K 7/1417; H05K 7/14; H05K 5/0069; H05K 5/0204; H05K 5/0217; G09F 9/301
See application file for complete search history.

(56) References Cited

U.S. PATENT DOCUMENTS

| | | | | |
|---|---|---|---|---|
| 7,839,656 | B2 * | 11/2010 | Schack | H05K 1/141 361/818 |
| 10,567,880 | B2 * | 2/2020 | Ham | H04R 9/06 |
| 10,635,381 | B2 * | 4/2020 | Nakano | G06F 3/147 |
| 11,706,882 | B2 * | 7/2023 | Kim | G09F 9/3026 361/730 |
| 11,985,782 | B2 * | 5/2024 | Yang | G06F 1/183 |
| 12,309,947 | B2 * | 5/2025 | Liu | G09F 9/30 |

(Continued)

FOREIGN PATENT DOCUMENTS

| | | |
|---|---|---|
| CN | 207252101 U | 4/2018 |
| CN | 209356619 U | 9/2019 |

(Continued)

*Primary Examiner* — Rockshana D Chowdhury

(57) ABSTRACT

A connection mechanism for connecting a printed circuit board and a back plate, and a display device are disclosed. The connection mechanism includes a connecting device and a fixing device, the connecting device having one side connected to the back plate, and another side connected to the fixing device. The fixing device is used to fix up the printed circuit board. The connecting device includes multiple locking structures connected end to end. A movable assembly is disposed on a side of a first locking structure facing towards the back plate, and there is further disposed a movable assembly between every two adjacent locking structures, which are rotatably connected together through the respective movable assembly. The multiple locking structures are operative to rotate relative to each other, driving the fixing device to be oriented parallel to the back plate or folded to a back of the back plate.

16 Claims, 6 Drawing Sheets

(56) References Cited

U.S. PATENT DOCUMENTS

| | | | | |
|---|---|---|---|---|
| 2020/0275562 | A1* | 8/2020 | Jiang | G09F 9/3026 |
| 2020/0389987 | A1* | 12/2020 | Kanno | G09F 13/0445 |
| 2022/0102672 | A1* | 3/2022 | Wang | H10K 77/111 |
| 2022/0201883 | A1* | 6/2022 | Cho | G02F 1/133305 |
| 2023/0164936 | A1* | 5/2023 | Kang | H05K 5/0217<br>361/807 |
| 2023/0269887 | A1* | 8/2023 | Kim | F16M 11/22<br>361/807 |
| 2024/0397682 | A1* | 11/2024 | Seo | B60K 35/22 |

FOREIGN PATENT DOCUMENTS

| | | | |
|---|---|---|---|
| CN | 209402231 | U | 9/2019 |
| CN | 212413209 | U | 1/2021 |
| CN | 212510372 | U | 2/2021 |
| CN | 215068054 | U | 12/2021 |
| CN | 114060397 | A | 2/2022 |
| CN | 114627748 | A | 6/2022 |
| CN | 217847355 | U | 11/2022 |
| CN | 219230587 | U | 6/2023 |

* cited by examiner

FOLDABLE CONNECTION MECHANISM WITH ARTICULATED LOCKING STRUCTURES AND DISPLAY DEVICE

CROSS-REFERENCE TO RELATED APPLICATIONS

This application claims the priority and benefit of Chinese patent application number 2023108408516, titled "Connection Mechanism and Display Device" and filed Jul. 11, 2023 with China National Intellectual Property Administration, the entire contents of which are incorporated herein by reference.

TECHNICAL FIELD

This application relates to the field of display, and more particularly relates to a connection mechanism and a display device.

BACKGROUND

The description provided in this section is intended for the mere purpose of providing background information related to the present application but doesn't necessarily constitute prior art.

With the rapid development of display technology, there are many different types of displays on the market, such as flat-screen displays and curved-screen displays. Due to the different designs of the two types, the methods of connecting the printed circuit board to the back plate are also different. In flat-screen displays, the printed circuit board may be connected horizontally to the display panel and the back plate, while in curved-screen displays the printed circuit board may be folded to a back of the back plate for connection.

A connecting device used to connect the printed circuit board to the back plate may only fit one type of display for installation purposes. When assembling the printed circuit board and back plate of different models, different connecting devices need to be replaced for connection, which greatly affects product applicability and increases assembly difficulty and assembly costs.

Therefore, how to switch the mode of connection between the printed circuit board and the back plate in different types of display devices to improve product applicability has become an urgent problem in this field that needs to be solved.

SUMMARY

This application discloses a connection mechanism and a display device, for one purpose of switching the mode of connection between the printed circuit board and the back plate in different types of display devices to improve product applicability.

This application discloses a connection mechanism for connecting a printed circuit board and a back plate. The connection mechanism includes a connecting device and a fixing device. One side of the connecting device is connected to the back plate, and the other side is connected to the fixing device. The fixing device is used to fix the printed circuit board. The connecting device includes a plurality of locking structures connected end to end. The first locking structure is disposed adjacent to the side of the back plate. There is disposed a movable assembly between every two adjacent locking structures. Every two adjacent locking structures are rotatably connected through the movable assembly. The plurality of locking structures are operative to rotate relative to each other, driving the fixing device to be parallel to the back plate or folded to a back of the back plate.

Optionally, the locking structure includes a housing and a rotating part. The rotary piece is arranged in the housing. The rotating part includes a rotating body and a connecting plate. Both the rotating body and the housing are cylindrical. One side of the connecting plate is connected to an exterior of the rotating body. The locking structure includes a first locking structure and a second locking structure that are adjacently arranged. In the first locking structure, the housing is provided with a first through-slot corresponding to a position of the connecting plate. One side of the connecting plate is connected to the exterior of the rotating body, and the other side extends outward from the first through-slot. The connecting plate in the first locking structure can rotate along a slotting direction of the first through-slot, and an angle of rotation of the connecting plate is less than or equal to 90°. In the second locking structure, the housing is further provided with a second through-slot corresponding to the position of the connecting plate of the first locking structure. The connecting plate of the first locking structure extends into the second through-slot and is rotatably connected to the housing. The connecting plate of the first locking structure can rotate along a slotting direction of the second through-slot, and the connecting plate of the first locking structure is operative to rotate at an angle less than or equal to 90° in the second through-slot.

Optionally, the movable assembly is disposed in the housing of each of both the first locking structure and the second locking structure. The movable assembly includes an electromagnet, an elastic piece, and a stopper piece. In the movable assembly of the second locking structure, the electromagnet is arranged adjacent to the connecting plate of the first locking structure. Two ends of the electromagnet are each provided with a rotating shaft. The housing is provided with a rotating shaft hole corresponding to the position of the rotating shaft. The rotating shaft is inserted into the rotating shaft hole, so that the electromagnet is rotatably connected to the housing. The connecting plate of the first locking structure passes through the second through-slot and is connected to one side of the electromagnet. The other side of the electromagnet is connected to one end of the elastic piece. The other end of the elastic piece is connected to the stopper piece. The locking piece is magnetic. A plurality of fixing teeth are disposed on the side of the stopper piece away from the elastic piece. An outer surface of each of the rotating body of the first locking structure and the second locking structure is provided with a plurality of engaging teeth. The fixing teeth are operative to engage with the locking engaging teeth. When the electromagnet is powered off, the fixing teeth engage with the engaging teeth of the rotating body in the second locking structure. When the electromagnet is energized, the electromagnet attracts the stopper piece, and the fixing teeth are disengaged from the engaging teeth of the rotating body in the second locking structure.

Optionally, the stopper piece is provided with a protruding bar on each of both sides. The housing is provided with a chute at a position corresponding to the protruding bar. The chute extends in a direction of starting from the electromagnet and pointing to the locking piece. The protruding bar is embedded in the slide groove and can slide along an extending direction of the slide groove.

Optionally, an extension length of the slide groove in the direction of the electromagnet toward the stopper piece is less than or equal to an maximum amount of extension and compression of the elastic piece.

Optionally, the locking structure further includes a limiting casing. The limiting casing is arranged inside the housing. The shape of the limiting casing matches the shape of the rotating body. The rotating body is embedded in the limiting casing. The limiting casing is provided with a third through-slot corresponding to the position of the connecting plate. The third through-slot has an equal size to the first through-slot. The connecting plate extends outward from the first through-slot and the third through-slot in sequence, and is connected to the adjacent housing of the locking structure. A limiting slot is defined in both sides of the limiting casing. The housing is provided with a limiting protrusion corresponding to the position of each limiting groove. The limiting protrusion is embedded in the limiting groove and is fitted with and fixed to the limiting groove.

Optionally, the fixing device includes a first clamping plate and a second clamping plate. The first clamping plate and the second clamping plate are spaced apart from each other. The first clamping plate and the second clamping plate clamp the printed circuit board from both sides in the width of the printed circuit board.

Optionally, the fixing device further includes a pre-pressing plate. The pre-pressing plate is arranged between the first clamping plate and the second clamping plate. A first elastic piece is arranged between the pre-pressing plate and the second clamping plate. One side of the first elastic piece is connected to the pre-pressing plate, and the other side is connected to the second clamping plate. The printed circuit board is clamped between the first clamping plate and the pre-pressing plate.

This application further discloses a display device, including a back plate, a display panel, and a printed circuit board. The back plate is disposed on a side of a light incident surface of the display panel. The display device further includes the above-mentioned connecting mechanism. One side of the connection mechanism is connected to the back plate, and the other side is connected to the printed circuit board.

Optionally, a magnetic region is disposed on the side of the back plate away from the display panel. The fixing device of the connection mechanism is provided with a magnet corresponding to the position of the magnetic region. the fixing device is folded to the side of the back plate facing away from the display panel, the magnet and the magnetic region are attracted and fixed to each other.

This application improves the connection mechanism for connecting the printed circuit board and the back plate. First, the printed circuit board is fixed to the connection mechanism using the fixing device in the connection mechanism to prevent the printed circuit board from shaking and ensure the stability of the connection of the printed circuit board. Then the printed circuit board and the back plate are connected through the connecting device. The connecting device is of a chain structure formed by connecting multiple locking structures end to end, where every two adjacent locking structures are rotatably connected through a movable assembly, so that the movable assembly achieves a “joint”-like function in the entire connecting device. The multiple locking structures are operative to rotate with respect to each other through the movable assemblies so that the entire connecting device can be adjusted relative to the position of the back plate. Thus, depending on the type of the display device, the fixing device can be driven to be parallel to the back plate or folded to the back of the back plate. In this way, the connection mode between the printed circuit board and the back plate can be switched in different types of display devices to improve product applicability.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative. In the drawings.

Figure 1:
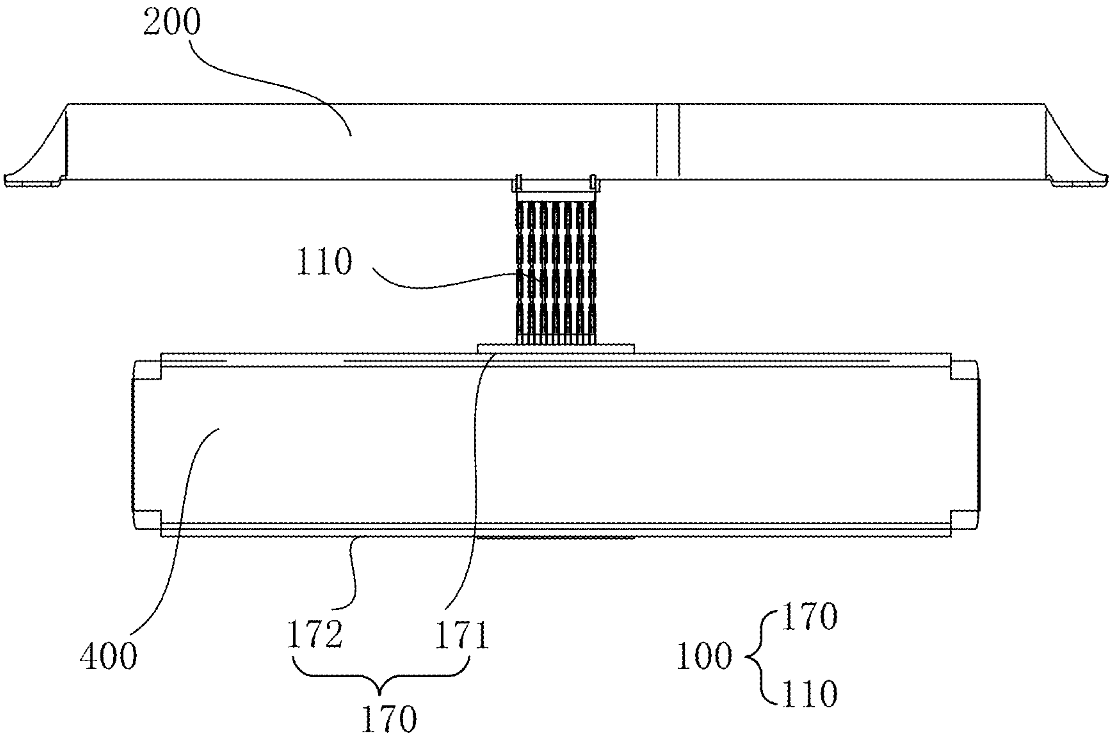
FIG. 1 is a schematic diagram of a first embodiment of a connection mechanism according to the present application.

In the drawings: 10. Display device; 100. Connection mechanism; 110. Connecting device; 111. Locking structure; 112. Housing; 113. First through-slot; 114. Second through-slot; 115. Rotating shaft hole; 116. Slide groove; 117. Third through-slot; 118. Limiting protrusion; 120. Rotary piece; 121. Rotating body; 122. Engaging teeth; 123. Connecting plate; 130. First locking structure; 140. Second locking structure; 150. Limiting casing; 151. Limiting groove; 160. Movable assembly; 161. Electromagnet; 162. Rotating shaft; 163. Elastic piece; 164. Stopper piece; 165. Fixing teeth; 167. Protruding bar; 170. Fixing device; 171. First clamping plate; 172. Second clamping plate; 173. Pre-pressing plate; 174. First elastic piece; 175. Magnet; 200. Back plate; 210. Magnetic region; 300. Display panel; 400. Printed circuit board.

DETAILED DESCRIPTION OF EMBODIMENTS

This application will be described in detail below with reference to the accompanying drawings and optional embodiments. It should be noted that should no conflict is present, the various embodiments or technical features described below may be combined arbitrarily to obtain new embodiments.

FIG. 1 is a schematic diagram a first embodiment of a connection mechanism according to the present application. As illustrated in FIG. 1, this application discloses a connection mechanism 100 for connecting a printed circuit board 400 and a back plate 200. The connection mechanism 100 includes a connecting device 110 and a fixing device 170. One side of the connecting device 110 is connected to the back plate 200 and the other side of the connecting device 110 is connected to the fixing device 170. The fixing device 170 is used to fix up the printed circuit board 400. The connecting device 110 includes a plurality of locking structures 111 that are connected end to end. One movable assembly 160 is disposed on a side of the first locking structure 111 facing towards the back plate 200. One movable assembly 160 is further disposed between every two adjacent locking structures 111. Every two adjacent locking structures 111 are rotatably connected to each other through the respective movable assembly 160. The plurality of locking structures 111 are operative to rotate relative to each other thus driving the fixing device 170 to be oriented parallel to the back plate 200 or be folded to a back of the back plate 200.

This application improves the connection mechanism 100 for connecting the printed circuit board 400 and the back plate 200. First, the printed circuit board 400 is fixed to the connection mechanism 100 using the fixing device 170 of the connection mechanism 100 to prevent the printed circuit board 400 from shaking thereby ensuring the stability of the connection of the printed circuit board 400. Then the printed circuit board 400 and the back plate 200 are connected together through the connecting device 110. The connecting device 110 is of a chain structure that is formed by connecting multiple locking structures 111 end to end, where every two adjacent locking structures 111 are rotatably connected to each other through one movable assembly 160, so that the movable assembly 160 achieves a "joint"-like function in the entire connecting device 110. The multiple locking structures 111 are operative to rotate with respect to each other through the movable assemblies 160 so that the position of the entire connecting device 110 may be adjusted relative to the back plate 200. Thus, depending on the type of the display device 10, the fixing device 170 may be driven to be oriented parallel to the back plate 200 or folded to the back of the back plate 200. In this way, the mode of connection between the printed circuit board 400 and the back plate 200 may be switched in different types of display devices 10 thus improving product applicability.

Figure 2:
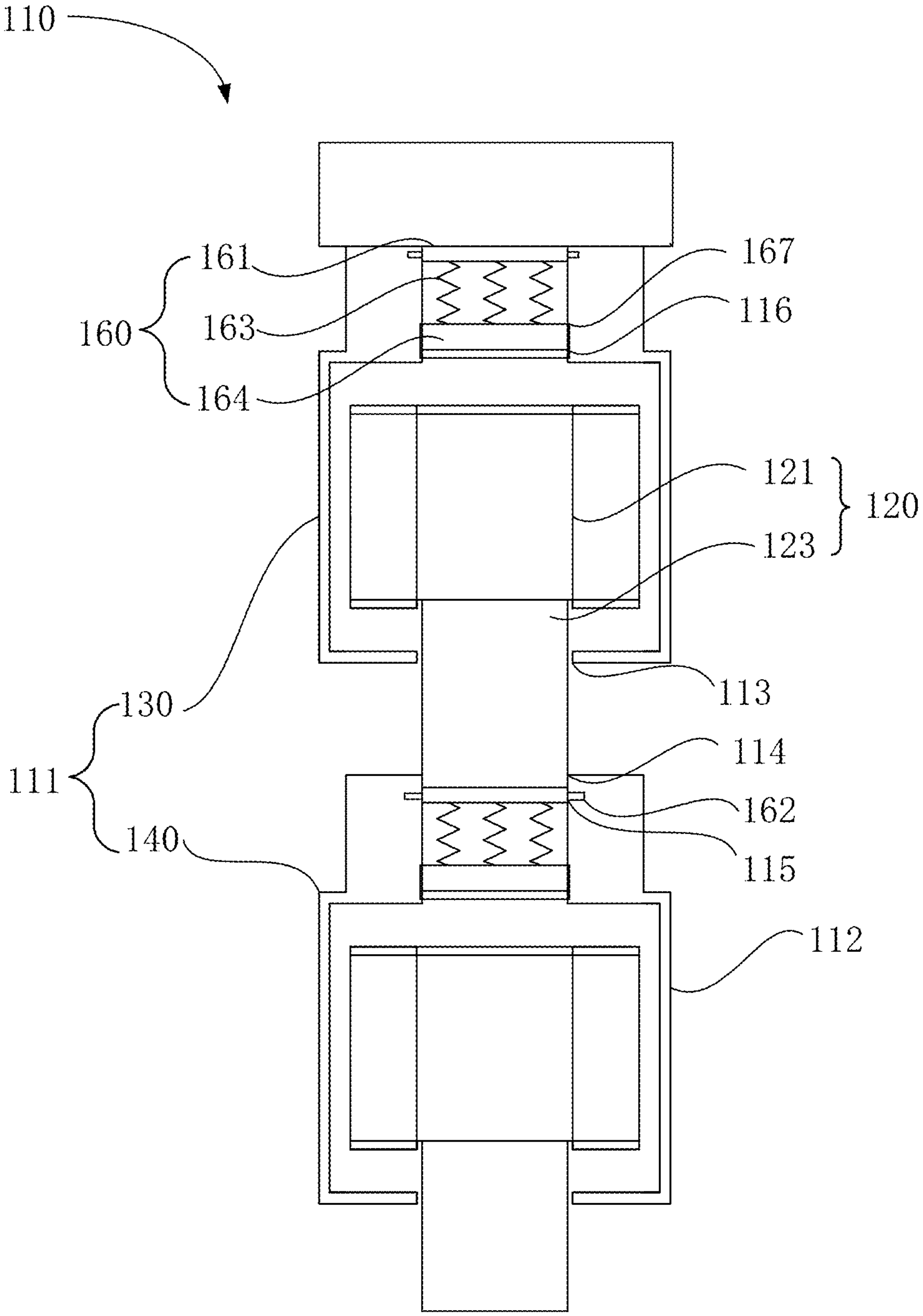
FIG. 2 is a partial schematic diagram of a connecting device in the first embodiment of the connection mechanism according to the present application.
Figure 3:
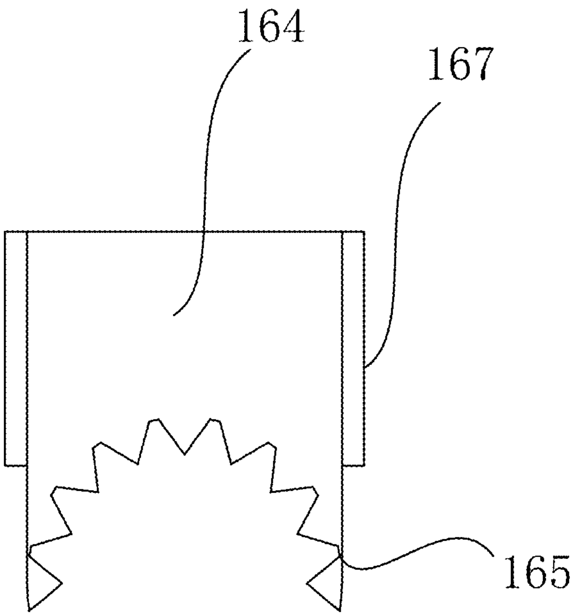
FIG. 3 is a schematic diagram of a stopper piece in the first embodiment of the connection mechanism according to the present application.
Figure 4:
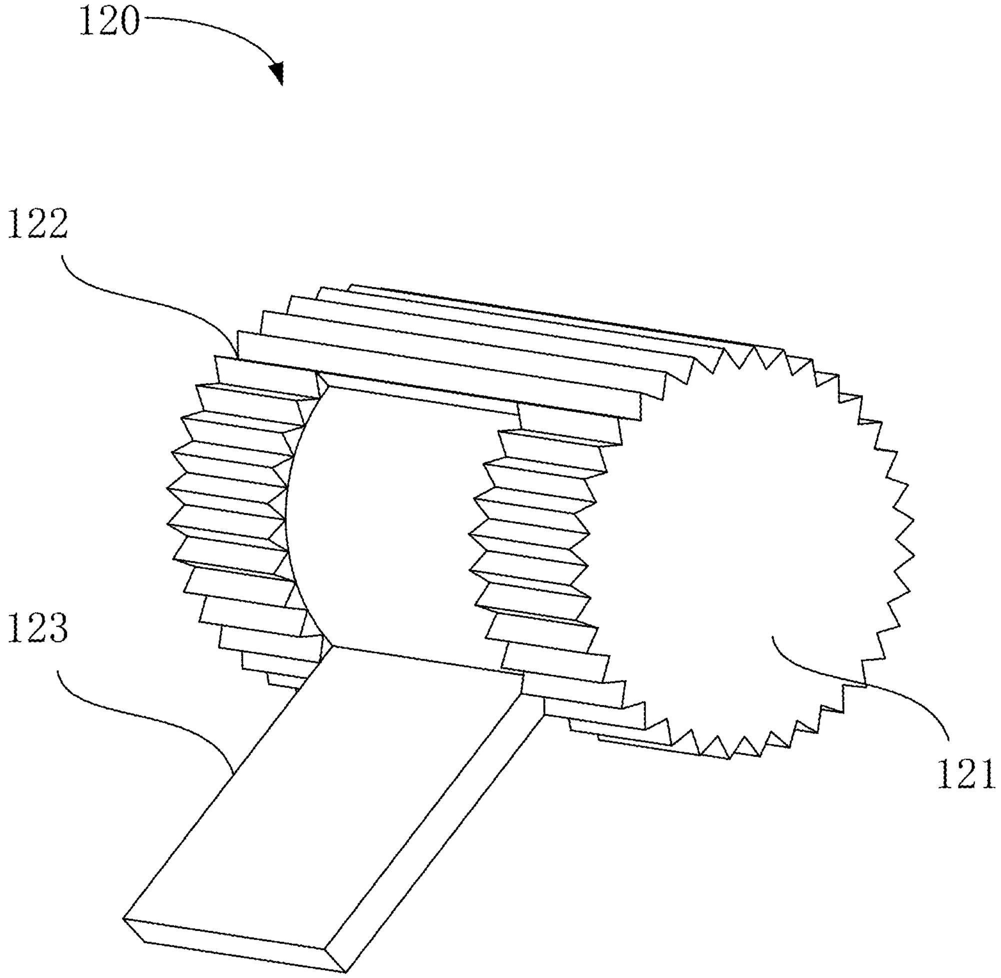
FIG. 4 is a schematic diagram of a rotary piece in the first embodiment of the connection mechanism according to the present application.

FIG. 2 is a partial schematic diagram of a connecting device in the first embodiment of the connection mechanism according to the present application. FIG. 3 is a schematic diagram of a stopper piece in the first embodiment of the connection mechanism according to the present application. FIG. 4 is a schematic diagram of a rotary piece in the first embodiment of the connection mechanism according to the present application. As illustrated in FIGS. 2 to 4, each locking structure 111 includes a housing 112 and a rotary piece 120. The rotary piece 120 is arranged in the housing 112. The rotary piece 120 includes a rotating body 121 and a connecting plate 123. Both the rotating body 121 and the housing 112 are cylindrical. One side of the connecting plate 123 is connected to an exterior of the rotating body 121. The locking structures 111 include a first locking structure 130 and a second locking structure 140 that are arranged adjacent to each other. In the first locking structure 130, the housing 112 of the first locking structure defines a first through-slot 113 at a position corresponding to the connecting plate 123. One side of the connecting plate 123 is connected to the exterior of the rotating body 121, and the other side of the connecting plate 123 extends outward from the first through-slot 113. The connecting plate 123 in the first locking structure 130 is operative to rotate along a slotting direction of the first through-slot 113, and an angle of rotation of the connecting plate 123 is less than or equal to 90°. In the second locking structure 140, the housing 112 of the second locking structure 140 further defines a second through-slot 114 at a position corresponding to the connecting plate 123 of the first locking structure 130. The connecting plate 123 of the first locking structure 130 extends into the second through-slot 114 and is rotatably connected to the housing 112 of the second locking structure 140. The connecting plate 123 of the first locking structure 130 is operative to rotate along a slotting direction of the second through-slot 114, and the connecting plate 123 of the first locking structure 130 is operative to rotate at an angle less than or equal to 90° in the second through-slot 114.

Since the housing 112 and the rotating body 121 located inside the housing 112 in this application are both cylindrical, the rotating body 121 may rotate relative to the housing 112 within the housing 112. Then when the rotating body 121 rotates, it will drive the connecting plate 123 to rotate. The range of rotation of the connecting plate 123 and the rotating body 121 depends on the size of the first through-slot 113 and the second through-slot 114. When the connecting plate 123 in the first locking structure 130 extends out of the first through-slot 113 and extends into the second through-slot 114 in the housing 112 of the second locking structure 140 to be connected to the housing 112 of the second locking structure 140, the connecting plate 123 of the first locking structure 130 connects the first locking structure 130 and the second locking structure 140, and the connecting plate 123 of the second locking structure 140 connects two adjacent locking structures 111, thereby enabling every two adjacent locking structures 111 to rotate relative to each other through the respective connecting plate 123. The angle of rotation of the connecting plate 123 between two adjacent locking structures 111 is less than or equal to 90°. After the plurality of locking structures 111 rotate together, the entire connecting device 110 can be more easily folded to the back of the back plate 200 or kept parallel with respect to the back plate 200.

Further, a movable assembly 160 is disposed in the housing 112 of each of the first locking structure 130 and the second locking structure 140. The movable assembly 160 includes an electromagnet 161, an elastic piece 163, and a stopper piece 164. In the movable assembly 160 of the second locking structure 140, the electromagnet 161 is disposed adjacent to the connecting plate 123 of the first locking structure 130, where two ends of the electromagnet 161 each include a rotating shaft 162. The housing 112 defines a rotating shaft hole 115 corresponding to the position of each rotating shaft 162. Each rotating shaft 162 is inserted into the respective rotating shaft hole 115 to rotatably connect the electromagnet 161 to the housing 112. The connecting plate 123 of the first locking structure 130 passes through the second through-slot 114 and is connected to one side of the electromagnet 161. The other side of the electromagnet 161 is connected to one end of the elastic piece 163. The other end of the elastic piece 163 is connected to the stopper piece 164. The stopper piece 164 is magnetic. A plurality of fixing teeth 165 are disposed on the side of the stopper piece 164 facing away from the elastic piece 163. The outer surface of the rotating body 121 of the first locking structure 130 and the outer surface of the rotating body 121 of the second locking structure 140 each include a plurality of engaging teeth 122. The fixing teeth 165 are operative to be engaged with the respective engaging teeth 122. When the electromagnet 161 is powered off, the fixing teeth 165 are engaged with the engaging teeth 122 of the rotating body 121 in the second locking structure 140. When the electromagnet 161 is energized, the electromagnet 161 attracts the stopper piece 164 and the fixing teeth 165 disengage from the engaging teeth 122 of the rotating body 121 in the second locking structure 140.

In the first locking structure 130 and the second locking structure 140 that are adjacent to each other, the connecting plate 123 of the first locking structure 130 is connected to the electromagnet 161 disposed in the housing 112 of the second locking structure 140, and the electromagnet 161 is connected to the rotating shaft holes 115 in the housing 112 of the second locking structure 140 through the rotating shafts 162, thus realizing a rotatable connection between the connecting plate 123 of the first locking structure 130 and the second locking structure 140.

Furthermore, this application uses the movable assembly 160 between the first locking structure 130 and the second locking structure 140 to control the relative rotation and locking of the two adjacent locking structures 111. When the position of the printed circuit board 400 needs to be adjusted, the movable assemblies 160 are used to enable every two adjacent locking structures 111 to be rotatable relative to each other. When the printed circuit board 400 needs to be fixed, the movable assemblies 160 are used to lock every two adjacent locking structures 111 to prevent the locking structures 111 from rotating relative to each other.

In addition, a power supply may be disposed in the connection mechanism 100 or on the back plate 200 to supply power to the electromagnet 161 and control the electromagnet 161 to produce electromagnetism. The specific working principle is as follows. When the electromagnet 161 is energized, an attractive force is produced between the electromagnet 161 and the stopper piece 164. Accordingly, the locking piece 164 is attracted by the electromagnet 161 and moves toward the electromagnet 161. During the movement of the stopper piece 164, the elastic piece 163 will be compressed. As such, the fixing teeth 165 of the stopper piece 164 are disengaged from the engaging teeth 122 of the rotating body 121 in the second locking structure 140, and so the first locking structure 130 and the second locking structure 140 are operative to rotate relative to each other. As such, by rotating the plurality of locking structures 111 relative to each other, the relative position between the entire connecting device 110 and the back plate 200 may be adjusted. When the electromagnet 161 is powered off, then there is no attractive force between the electromagnet 161 and the stopper piece 164. At this time, the compressed elastic piece 163 will release its amount of compression and push the stopper piece 164 in the direction away from the electromagnet 161 until the fixing teeth 165 of the stopper piece 164 engage with the engaging teeth 122 of the rotating body 121 in the second locking structure 140, so that the first locking structure 130 and the second locking structure 140 are locked up to achieve a final fixed form, so that the printed circuit board 400 is connected through the connecting device 110.

Further, the stopper piece 164 includes a protruding bar 167 on each of both sides, and the housing 112 defines a slide groove 116 corresponding to the position of each protruding bar 167. The slide groove 116 extends in the direction pointing from the electromagnet 161 toward the stopper piece 164. Each protruding bar 167 is embedded in the respective slide groove 116 and is operative to slide along a direction of extension of the respective slide groove 116.

When the electromagnet 161 is energized, an attractive force is produced between the electromagnet 161 and the stopper piece 164. The stopper piece 164 utilizes the protruding bars 167 on both sides to move along the respective slide grooves 116 in a direction of approaching the electromagnet 161 and moving away from the rotating body 121 in the second locking structure 140. When the electromagnet 161 is powered off, there is no attractive force between the electromagnet 161 and the stopper piece 164. At this time, the compressed elastic piece 163 will release its amount of compression and push the stopper piece 164 away from the electromagnet 161. At this time, the protruding bars 167 on both sides of the stopper piece 164 move along the respective slide grooves 116 in a direction away from the electromagnet 161. The cooperation between the slide grooves 116 and the protruding bars 167 is used to restrict the moving path of the stopper piece 164 such that the stopper piece 164 moves more stably in the housing 112 and is less likely to be displaced.

Furthermore, a length of extension of each slide groove 116 in the direction pointing from the electromagnet toward the stopper piece is less than or equal to a maximum amount of extension and compression of the elastic piece 163. This design can effectively prevent occurrence of damage to the elastic piece 163 due to excessive displacement of the stopper piece 164 in the slide groove 116 that exceeds the maximum amount of extension and compression of the elastic piece 163.

The fixing device 170 in this application includes a first clamping plate 171 and a second clamping plate 172. The first clamping plate 171 and the second clamping plate 172 are spaced apart from each other. The first clamping plate 171 and the second clamping plate 172 clamp the printed circuit board 400 from both sides in a width of the printed circuit board 400.

When assembling the printed circuit board 400 and the fixing device 170, it is merely needed to embed the printed circuit board 400 between the first clamping plate 171 and the second clamping plate 172, so that the first clamping plate 171 and the second clamping plate clamp the printed circuit board 400 from both sides in the width of the printed circuit board 400 thus completing the installation of the printed circuit board 400 and the fixing device 170, hence simple and convenient installation, and easy replacement of the printed circuit board 400. Furthermore, the printed circuit board 400 is not easily detached from the fixing device 170 by means of clamping and fixing, which further improves the fixing stability of the printed circuit board 400.

Figure 5:
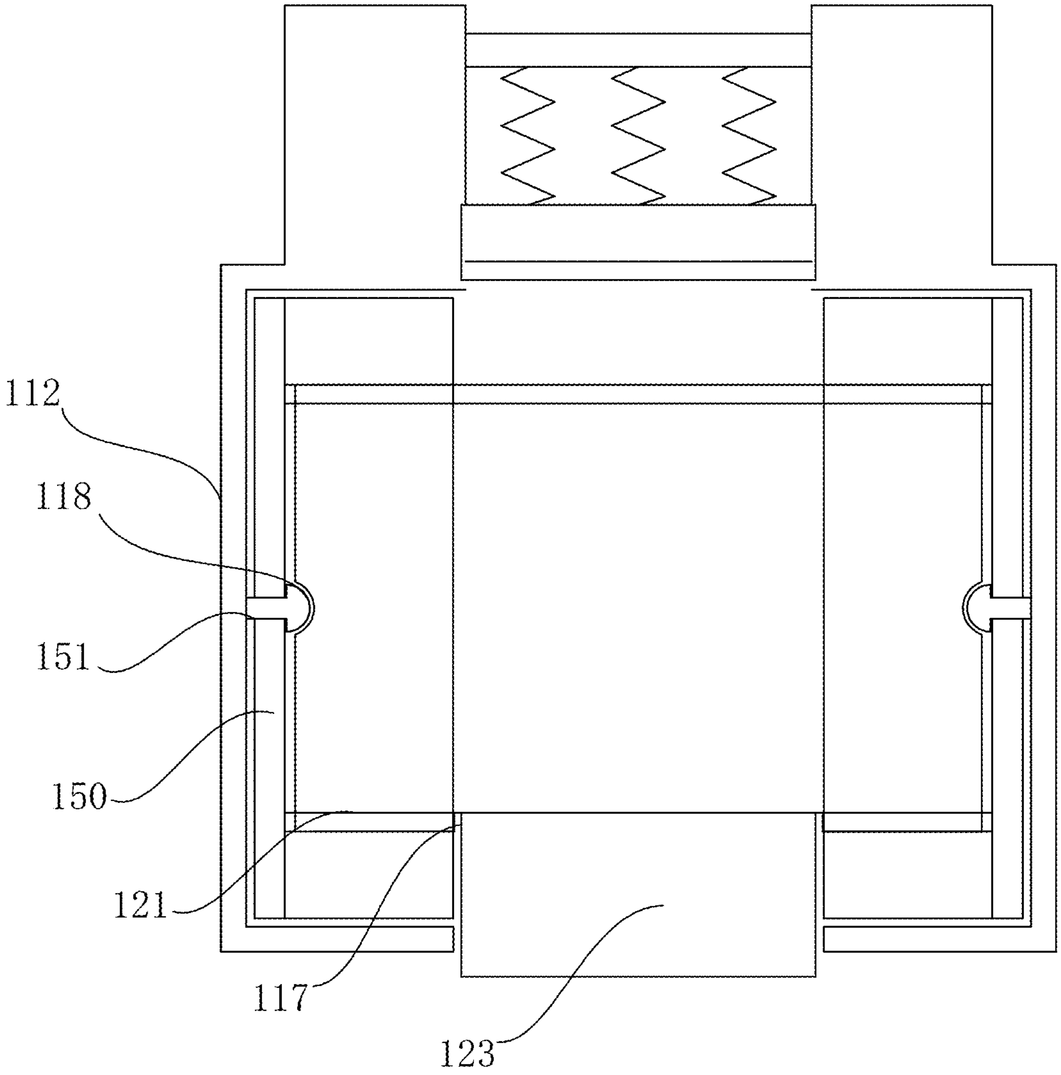
FIG. 5 is a schematic diagram of a second embodiment of the connection mechanism according to the present application.

FIG. 5 is a schematic diagram of a second embodiment of the connection mechanism according to the present application. As illustrated in FIG. 5, the embodiment illustrated in FIG. 5 is an improvement based on FIG. 1. Each locking structure 111 further includes a limiting casing 150. The limiting casing 150 is disposed in the housing 112. The shape of the limiting casing 150 matches the shape of the rotating body 121. The rotating body 121 is embedded in the limiting casing 150. The limiting casing 150 defines a third through-slot 117 at a position corresponding to the connecting plate 123. The size of the third through-slot 117 is equal to that of the first through-slot 113. The connecting plate 123 extends outward from the first through groove 113 and the third through groove 117 in sequence and is connected to the housing 112 of the adjacent locking structure 111. A limiting groove 151 is defined in each of both sides of the limiting casing 150. The housing 112 defines a limiting protrusion 118 at a position corresponding to each limiting groove 151. Each limiting protrusion 118 is embedded in the respective limiting groove 151 and engaged with the respective limiting groove 151 so as to be fixedly connected together.

The difference between this embodiment and the embodiment illustrated in FIG. 1 is that in this embodiment a limiting casing 150 is additionally designed in the housing 112, and the rotating body 121 is restricted through the limiting casing 150. After the rotating body 121 is embedded in the limiting casing 150, it is not easy to shake in the limiting casing 150, which prevents the rotating body 121 from being displaced relative to the housing 112 when rotating in the housing 112, which may otherwise affect the normal operation of the connecting device 110.

Limiting grooves 151 are defined in the limiting casing 150, and limiting protrusions 118 are disposed on the housing 112 at positions corresponding to the limiting grooves 151. Through the engagement and fixation between the limiting grooves 151 and the limiting protrusions 118, the limiting casing 150 and the housing 112 are stably fixed to each other. This prevents relative rotation between the limiting casing 150 and the housing 112, which may otherwise result in misalignment between the positions of the third through-slot 117 and the first through-slot 113 thus affecting the normal rotation of the connecting plate 123, thereby further improving the stability of rotation of the connecting device 110.

Figure 6:
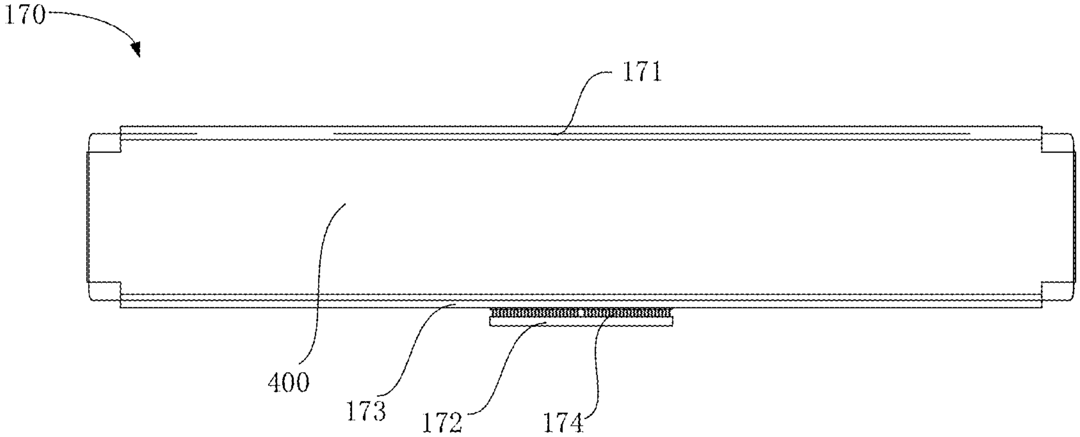
FIG. 6 is a schematic diagram of a third embodiment of the connection mechanism according to the present application.

FIG. 6 is a schematic diagram of a third embodiment of the connection mechanism according to the present application. As illustrated in FIG. 6, the fixing device 170 further includes a pre-pressing plate 173. The pre-pressing plate 173 is disposed between the first clamping plate 171 and the second clamping plate 172. A first elastic piece 174 is disposed between the pre-pressing plate 173 and the second clamping plate 172. One side of the first elastic piece 174 is connected to the pre-pressing plate 173, and the other side of the first elastic piece 174 is connected to the second clamping plate 172. The printed circuit board 400 is clamped between the first clamping plate 171 and the pre-pressing plate 173.

The difference between this embodiment and the previous embodiment lies in that in this embodiment a pre-pressing plate 173 is further arranged between the first clamping plate 171 and the second clamping plate 172. The pre-pressing plate 173 is connected to the second clamping plate 172 through the first elastic piece 174. The first elastic piece 174 may be a spring. A plurality of such springs may be disposed between the pre-pressing plate 173 and the second clamping plate 172 so that the elastic extension and compression of the springs are used to control the distance between the pre-pressing plate 173 and the first clamping plate 171.

As such, when a relatively wide printed circuit board 400 needs to be installed on the fixing device 170, the printed circuit board 400 is first placed between the first clamping plate 171 and the pre-pressing plate 173. At this time, one side of the printed circuit board 400 will press the pre-pressing plate 173. The spring between the pre-pressing plate 173 and the second clamping plate 172 is compressed by the pressing force, and the distance between the pre-pressing plate 173 and the first clamping plate 171 increases to accommodate the installation of the relatively wide printed circuit board 400. Furthermore, the elastic restoring force produced by the spring after being compressed is used to cause the spring to press the pre-pressing plate 173 toward the side of first clamping plate 171, so that the pre-pressing plate 173 and the first clamping plate 171 clamp the printed circuit board 400 from both sides in the width of the printed circuit board 400.

When a relatively narrow printed circuit board 400 needs to be installed on the fixing device 170, the spring between the pre-pressing plate 173 and the second clamping plate 172 will release part of the amount of compression so that the distance between the pre-pressing plate 173 and the first clamping plate 171 is reduced to adapt to the installation of the relatively narrow printed circuit board 400. In this way, the fixing device 170 can be used to fix up printed circuit boards 400 of different specifications thus improving the applicability of the connection mechanism 100.

Figure 7:
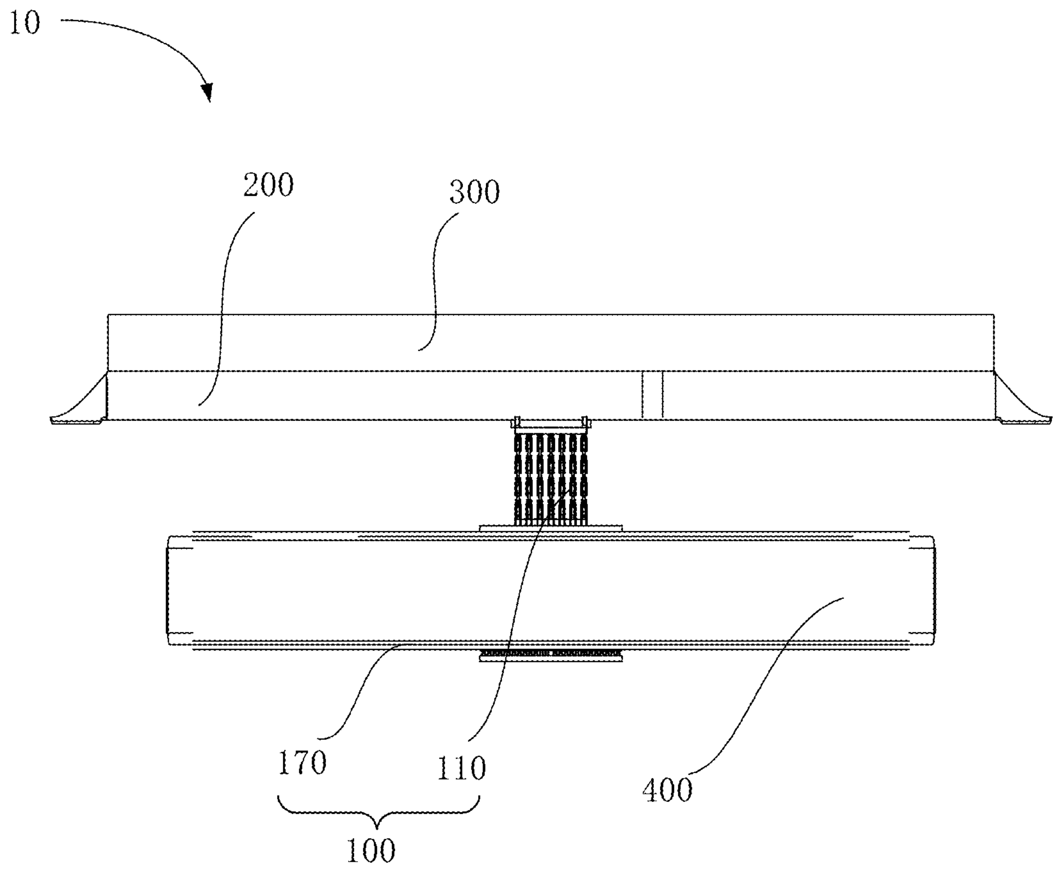
FIG. 7 is a schematic diagram of a first embodiment of a display device according to the present application.

FIG. 7 is a schematic diagram of a first embodiment of a display device according to the present application. As illustrated in FIG. 7, this application further discloses a display device 10, including a back plate 200, a display panel 300, and a printed circuit board 400. The back plate 200 is disposed on a side of a light incident surface of the display panel 300. The display device 10 further includes the above-mentioned connection mechanism 100. One side of the connection mechanism 100 is connected to the back plate 200, and the other side of the connection mechanism 100 is connected to the printed circuit board 400.

The display panel 300 may be connected to the printed circuit board 400 through a flexible cable. The printed circuit board 400 provides driving signals to the display panel 300. After the printed circuit board 400 is connected to the display panel 300, it needs to be fixed. First, after the printed circuit board 400 is fixed to the connection mechanism 100, the printed circuit board 400 is connected and fixed to the back plate 200 using the connection mechanism 100 so that the printed circuit board 400 is stable in position and is not prone to shaking or falling off, and can provide stable signal output for the display panel 300 to ensure the quality of the display device 10.

The general connection mechanism 100 is designed for a specific type of display device 10, and its position is fixed and cannot be adjusted. Therefore, when fixing the printed circuit board 400 in different types of display devices 10, the same connection mechanism 100 cannot be repeatedly used, which increases the complexity of assembly and increases the assembly costs.

In view of the above problems, this application improves the connection mechanism 100 in the display device 10. First, the printed circuit board 400 is fixed to the connection mechanism 100 using the fixing device 170 in the connection mechanism 100 to prevent the printed circuit board 400 from shaking thus ensuring the stability of the connection of the printed circuit board 400. Then the printed circuit board 400 and the back plate 200 are connected to each other through the connecting device 110. The connecting device 110 is a chain structure formed by connecting multiple locking structures 111 end to end, and every two adjacent locking structures 111 are rotatably connected through a movable assembly 160, so that the movable assembly 160 realizes a "joint"-like function in the entire connecting device 110. Through the rotation of the movable assemblies 160 with respect to each other, the plurality of locking structures 111 can adjust the position of the entire connecting device 110 relative to the back plate 200. Depending on the type of the display device 10, the fixing device 170 can be driven to be oriented parallel to the back plate 200 or folded to the back of the back plate 200. In this way, the mode of connection between the printed circuit board 400 and the back plate 200 can be switched in different types of display devices 10 thus improving the applicability of the product. Furthermore, one connection mechanism 100 can simultaneously meet the requirements for connecting the printed circuit board 400 and the back plate 200 in a variety of different display devices 10, thereby reducing assembly difficulty and assembly costs.

Figure 8:
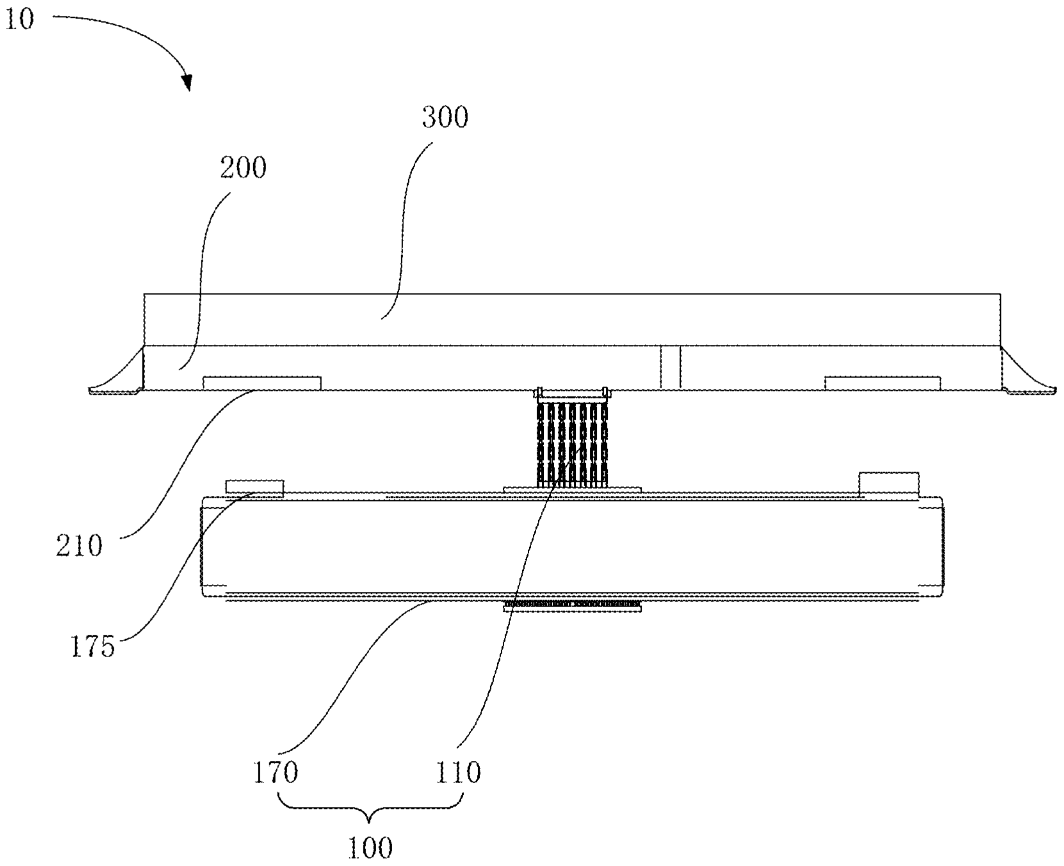
FIG. 8 is a schematic diagram of a second embodiment of the display device according to the present application.

FIG. 8 is a schematic diagram of a second embodiment of the display device according to the present application. As illustrated in FIG. 8, the embodiment shown in FIG. 8 is an improvement based on FIG. 7. A magnetic region 210 is set on the side of the back plate 200 facing away from the display panel 300. The fixing device 170 of the connection mechanism 100 includes a magnet 175 at a position corresponding to the magnetic region 210. When the fixing device 170 is folded to the side of the back plate 200 facing away from the display panel 300, the magnet 175 and the magnetic region 210 are attracted and fixed to each other.

The difference between this embodiment and the previous embodiment lies in that in this embodiment a magnetic region 210 is set on the back plate 200 and a magnet is disposed at the position of the fixing device 170 corresponding to the magnetic region 210. When the connecting device 110 drives the fixing device 170 to be folded to the back of the back plate 200, the magnetic region 210 on the back plate 200 can be magnetically attracted with the magnet 175 on the fixing device 170 so that a magnetic attraction is produced between the fixing device 170 and the back plate 200, and so the fixing device 170 can be stably connected to the back plate 200 without shaking, which effectively ensures the stability of connection of the printed circuit board 400.

Of course, the fixing device 170 of this application may also be made of a magnetic metal material. When the connecting device 110 drives the fixing device 170 to be folded to the back of the back plate 200, the magnetic region 210 of the back plate 200 may attract the entire fixing device 170, thereby increasing the magnetic area between the back plate 200 and the fixing device 170, which is conducive to improving the effect of magnetic attraction between the back plate 200 and the fixing device 170 so that the fixing device 170 is not easy to fall off from the back plate 200.

It should be noted that the inventive concept of this application can be formed into many embodiments, but the length of the application document is limited and so these embodiments cannot be enumerated on a one by one basis. The technical features may be arbitrarily combined to obtain a new embodiment, and the original technical effects may be enhanced after the various embodiments or technical features are combined.

The foregoing description is merely a further detailed description of this application made with reference to some specific illustrative embodiments, but the specific implementations of this application are not to be construed to be limited to these illustrative embodiments. For those having ordinary skill in the technical field to which this application pertains, numerous simple deductions or substitutions may be made without departing from the concept of this application, which shall all be regarded as falling in the scope of protection of this application.

What is claimed is:

1. A connection mechanism for connecting a printed circuit board and a back plate, the connection mechanism comprising a connecting device and a fixing device; wherein one side of the connecting device is connected to the back plate, and another side of the connecting device is connected to the fixing device, the fixing device being used to fix up the printed circuit board;

wherein the connecting device comprises a plurality of locking structures that are connected end to end, and further comprising a plurality of movable assemblies; wherein one of the plurality of movable assemblies is disposed on a side of a first one of the plurality of locking structures facing towards the back plate; and wherein a respective one of the plurality of movable assemblies is disposed between every two adjacent locking structures of the plurality of locking structures; wherein every two adjacent locking structures of the plurality of locking structures are rotatably connected to each other through the respective movable assembly;

wherein the plurality of locking structures are operative to rotate relative to each other thus driving the fixing device to be oriented parallel to the back plate or be folded to a back of the back plate;

wherein each of the plurality of locking structures comprises a housing and a rotary piece that is disposed in the housing; wherein the rotary piece comprises a rotating body and a connecting plate; wherein the rotating body and the housing are both cylindrical, and wherein one side of the connecting plate is connected to the rotating body.

2. The connection mechanism as recited in claim 1, wherein the plurality of locking structures comprise a first locking structure and a second locking structure that are arranged adjacent to each other; wherein in the first locking structure, the housing of the first locking structure defines a first through-slot disposed corresponding to a position of the connecting plate; wherein one side of the connecting plate is connected to an exterior of the rotating body, and wherein another side of the connecting plate extends outward from the first through-slot;

wherein the connecting plate in the first locking structure is operative to rotate along a slotting direction of the first through-slot; wherein in the second locking structure, the housing of the second locking structure further defines a second through-slot disposed at a position corresponding to the connecting plate of the first locking structure; wherein the connecting plate of the first locking structure extends into the second through-slot and is rotatably connected to the housing of the second locking structure;

wherein the connecting plate of the first locking structure is operative to rotate along a slotting direction of the second through-slot.

3. The connection mechanism as recited in claim 2, wherein an angle of rotation of the connecting plate is less than or equal to 90°.

4. The connection mechanism as recited in claim 2, wherein the connecting plate of the first locking structure is operative to rotate at an angle less than or equal to 90° in the second through-slot.

5. The connection mechanism as recited in claim 2, wherein the movable assembly is disposed in each of the housing of the first locking structure and the housing of the second locking structure; wherein each movable assembly comprises an electromagnet, an elastic piece, and a stopper piece;

wherein in the movable assembly of the second locking structure, the electromagnet is arranged adjacent to the connecting plate of the first locking structure; wherein both ends of the electromagnet each comprise a rotating shaft;

wherein the housing of the second locking structure defines a rotating shaft hole corresponding to a position of each rotating shaft; wherein each rotating shaft is inserted into the respective rotating shaft hole to rotatably connect the electromagnet to the housing of the second locking structure;

wherein the connecting plate of the first locking structure passes through the second through-slot and is connected to one side of the electromagnet, wherein another side of the electromagnet is connected to one end of the elastic piece, and wherein another end of the elastic piece is connected to the stopper piece.

6. The connection structure as recited in claim 5, wherein the stopper piece is magnetic; wherein there is disposed a plurality of fixing teeth on a side of the stopper piece facing away from the respective elastic piece; wherein there is further disposed a plurality of engaging teeth on an outer surface of the rotating body of each of the first locking structure and the second locking structure; and wherein the fixing teeth are operative to be engaged with the respective engaging teeth.

7. The connection structure as recited in claim 6, wherein in response to the electromagnet being powered off, the plurality of fixing teeth are operative to be engaged with the engaging teeth of the rotating body in the second locking structure; and wherein in response to the electromagnet being energized, the electromagnet is operative to attract the stopper piece and the fixing teeth are disengaged from the engaging teeth of the rotating body in the second locking structure.

8. The connection mechanism as recited in claim 7, wherein there is disposed a protruding bar on each of both sides of the stopper piece; and wherein the housing defines a slide groove corresponding to a position of each protruding bar; wherein each slide groove extends in a direction pointing from the respective electromagnet towards the respective stopper piece; and wherein each protruding bar is embedded in the respective slide groove and is operative to slide along a direction of extension of the respective slide groove.

9. The connection mechanism as recited in claim 8, wherein a length of extension of each slide groove in the direction of pointing from the electromagnet toward the stopper piece is less than or equal to a maximum amount of extension and compression of the respective elastic piece.

10. The connection mechanism as recited in claim 1, wherein each locking structure further comprises a limiting casing disposed in the housing; wherein the limiting casing has a shape matching a shape of the respective rotating body; wherein the rotating body is embedded in the limiting casing, and wherein the limiting casing defines a third through-slot corresponding to a position of the respective connecting plate, the third through-slot having a size equal to that of the first through-slot; and wherein the respective connecting plate extends outward from the first through-slot and the third through-slot in sequence, and is connected to the housing of the adjacent locking structure.

11. The connection mechanism as recited in claim 10, wherein a limiting groove is defined in each of both sides of the limiting casing, and wherein a limiting protrusion is disposed on the housing corresponding to the position of each limiting groove; wherein each limiting protrusion is embedded in the respective limiting groove and is fitted with and fixed to the respective limiting groove.

12. The connection mechanism as recited in claim 1, wherein the fixing device comprises a first clamping plate and a second clamping plate that are spaced apart from each other; wherein the first clamping plate and the second clamping plate are operative to clamp the printed circuit board from both sides in a width of the printed circuit board.

13. The connection mechanism as recited in claim 12, wherein the fixing device further comprises a pre-pressing plate disposed between the first clamping plate and the second clamping plate, wherein a first elastic piece is disposed between the pre-pressing plate and the second clamping plate; wherein one side of the first elastic piece is connected to the pre-pressing plate, and wherein another side of the first elastic piece is connected to the second clamping plate; wherein the printed circuit board is clamped between the first clamping plate and the pre-pressing plate.

14. The connection mechanism as recited in claim 13, wherein the first elastic piece is a spring, wherein there is disposed a plurality of the springs between the pre-pressing plate and the second clamping plate.

15. A display device, comprising a back plate, a display panel, and a printed circuit board; wherein the back plate is disposed on a side of a light-incident surface of the display panel; wherein the display device further comprises a connection mechanism, wherein one side of the connection mechanism is connected to the back plate, and wherein another side of the connection mechanism is connected to the printed circuit board; wherein the connection mechanism is used for connecting the printed circuit board and the back plate, wherein the connection mechanism comprises a connecting device and a fixing device; wherein one side of the connecting device is connected to the back plate, and another side of the connecting device is connected to the fixing device, the fixing device being used to fix up the printed circuit board;

wherein the connecting device comprises a plurality of locking structures that are connected end to end, and further comprising a plurality of movable assemblies; wherein one of the plurality of movable assemblies is disposed on a side of a first one of the plurality of locking structures facing towards the back plate; and wherein a respective one of the plurality of movable assemblies is disposed between every two adjacent locking structures of the plurality of locking structures; wherein every two adjacent locking structures of the plurality of locking structures are rotatably connected to each other through the respective movable assembly;

wherein the plurality of locking structures are operative to rotate relative to each other thus driving the fixing device to be oriented parallel to the back plate or be folded to a back of the back plate;

wherein a magnetic region is set on a side of the back plate facing away from the display panel, and wherein a magnet is disposed on the fixing device of the connection mechanism corresponding to the magnetic region, wherein when the fixing device is folded to the side of the back plate away from the display panel, the magnet and the magnetic region are attracted and fixed to each other.

16. The display device as recited in claim 15, wherein the fixing device is made of a magnetic metal material.

* * * * *